(12) United States Patent
Thompson et al.

(10) Patent No.: US 11,670,809 B2
(45) Date of Patent: Jun. 6, 2023

(54) SYSTEM AND METHOD OF CHARGING A RECHARGEABLE BATTERY

(71) Applicant: Dell Products L.P., Round Rock, TX (US)

(72) Inventors: Richard Christopher Thompson, Cedar Park, TX (US); Shao Szu Ho, New Taipei (TW); Wen-Yung Chang, Jhong Li (TW)

(73) Assignee: Dell Products L.P., Round Rock, TX (US)

( * ) Notice: Subject to any disclaimer, the term of this patent is extended or adjusted under 35 U.S.C. 154(b) by 163 days.

(21) Appl. No.: 17/236,515

(22) Filed: Apr. 21, 2021

(65) Prior Publication Data

US 2022/0344731 A1 Oct. 27, 2022

(51) Int. Cl.
*H01M 10/44* (2006.01)
*H01M 10/42* (2006.01)
(Continued)

(52) U.S. Cl.
CPC ...... *H01M 10/441* (2013.01); *G01R 31/3842* (2019.01); *H01M 10/425* (2013.01);
(Continued)

(58) Field of Classification Search
CPC ............. H01M 10/441; H01M 10/425; H01M 10/443; H01M 10/486; H01M 2010/4271; G01R 31/3842
(Continued)

(56) References Cited

U.S. PATENT DOCUMENTS

| 8,396,609 B2 * | 3/2013 | Wang | H02J 7/0013 |
| | | | 429/432 |
| 9,209,637 B2 * | 12/2015 | Monden | G01K 13/00 |

(Continued)

FOREIGN PATENT DOCUMENTS

| CN | 101689677 A | * | 3/2010 | .......... H01M 10/052 |
| CN | 1870346 B | * | 10/2010 | .......... H01M 10/441 |
| JP | 2004222427 A | * | 8/2004 | ............. Y02E 60/10 |

OTHER PUBLICATIONS

Qian, Jinrong. "Li-ion battery-charger solutions for JEITA compliance." *Analog Applications Journal* (2010): 8-11.

(Continued)

*Primary Examiner* — M Baye Diao
(74) *Attorney, Agent, or Firm* — McDermott Will & Emery LLP

(57) ABSTRACT

In one or more embodiments, one or more systems, one or more methods, and/or one or more processes: may determine that a rechargeable cell of multiple rechargeable cells has reached a top of charge voltage value; in response to determining that the rechargeable cell has reached the top of charge voltage value, may provide an electrical charge current, associated with a charge current value, to the rechargeable cell; may determine a temperature value associated with the rechargeable cell; may determine a charge current termination value based at least on the temperature value; while the charge current value is not at and is not below the charge current termination value: may determine the temperature value associated with the rechargeable cell; and may determine the charge current termination value based at least on the temperature value; and may cease providing the electrical charge current to the rechargeable cell.

20 Claims, 10 Drawing Sheets

(51) Int. Cl.
*H01M 10/48* (2006.01)
*G01R 31/3842* (2019.01)

(52) U.S. Cl.
CPC ....... *H01M 10/443* (2013.01); *H01M 10/486* (2013.01); *H01M 2010/4271* (2013.01)

(58) Field of Classification Search
USPC ......................................................... 320/137
See application file for complete search history.

(56) References Cited

U.S. PATENT DOCUMENTS

| | | | |
|---|---|---|---|
| 9,401,616 B2 * | 7/2016 | Yun ....................... | H01M 10/46 |
| 10,608,443 B2 * | 3/2020 | Thompson .......... | H01M 10/443 |
| 10,873,201 B2 * | 12/2020 | Cha ........................ | G01R 31/36 |
| 10,928,880 B2 * | 2/2021 | Sultenfuss ............. | G06F 1/266 |
| 11,088,407 B2 * | 8/2021 | Fang .................. | H01M 10/482 |
| 2012/0170157 A1 * | 7/2012 | Holsen .................... | G06F 1/263 |
| | | | 361/1 |
| 2017/0256825 A1 * | 9/2017 | Sun ....................... | H02J 7/0019 |
| 2019/0305386 A1 * | 10/2019 | Lee ...................... | G01R 31/392 |
| 2021/0408615 A1 * | 12/2021 | Myers ................. | H01M 10/488 |

OTHER PUBLICATIONS

"Putting Safety into Li-ion Battery Packs" Renesas Electronics.
A Guide to the Safe Use of Secondary Lithium Ion Batteries in Notebook-type Personal Computers. Japan Electronics and Information Technology Industries Association and Battery Association of Japan, Apr. 20, 2007.

\* cited by examiner

SYSTEM AND METHOD OF CHARGING A RECHARGEABLE BATTERY

BACKGROUND

Field of the Disclosure

This disclosure relates generally to information handling systems and more particularly to charging a rechargeable battery.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, one or more methods, and/or one or more processes: may determine that a rechargeable cell of multiple rechargeable cells has reached a top of charge voltage value; may provide an electrical charge current, associated with a charge current value, to the rechargeable cell; may determine a temperature value associated with the rechargeable cell; may determine a charge current termination value based at least on the temperature value; while the charge current value is not at and is not below the charge current termination value: may determine the temperature value associated with the rechargeable cell; and may determine the charge current termination value based at least on the temperature value; and may cease providing the electrical charge current to the rechargeable cell. In one or more embodiments, providing the electrical charge current to the rechargeable cell may be performed in response to determining that the rechargeable cell has reached the top of charge voltage value.

In one or more embodiments, the one or more systems, the one or more methods, and/or the one or more processes may further determine that the temperature value is within a range of temperature values. For example, determining the charge current termination value based at least on the temperature value may include determining the charge current termination value based at least on the range of temperature values. In one or more embodiments, providing the electrical charge current to the rechargeable cell may include decreasing the electrical charge current as time increases. For example, decreasing the electrical charge current as the time increases may include providing the electrical charge current as an exponential decay. In one or more embodiments, determining the temperature value associated with the rechargeable cell may include receiving the temperature value from a temperature sensor. For example, a rechargeable battery that includes the rechargeable cell may include the temperature sensor. In one or more embodiments, providing the electrical charge current to the rechargeable cell may include configuring a current source to provide the electrical charge current to the rechargeable cell.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1A:
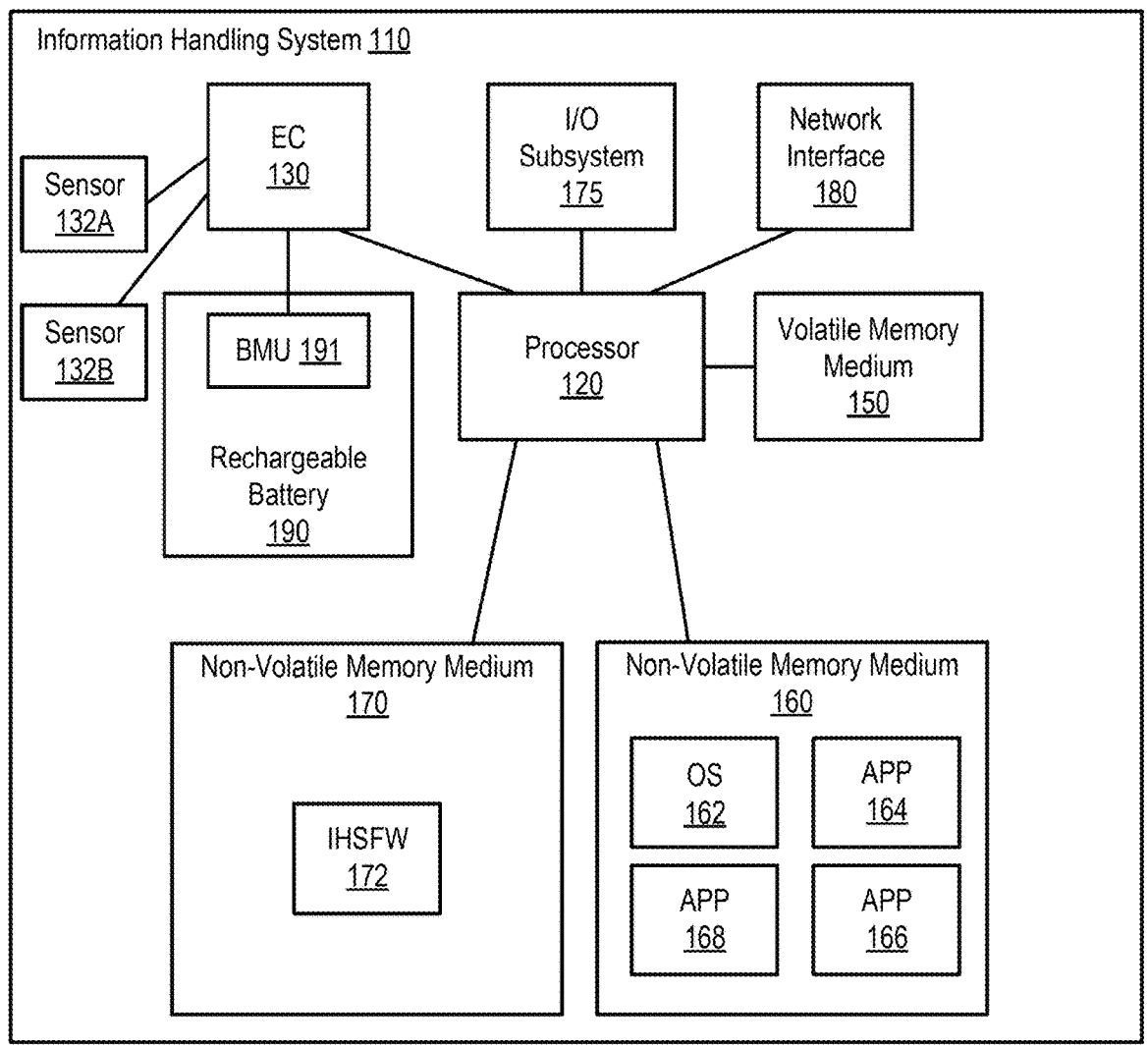
FIG. 1A illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, rechargeable battery longevity and reducing rechargeable battery wear out may improve performance of information handling systems. For example, as mobile information handling systems become smaller and more powerful, power density and/or thermal density may increase, which may result in high temperature exposure for rechargeable batteries. In one or more embodiments, methods to reduce battery stress at high temperatures may include one or more of lowering a top of charge voltage, reducing a charge rate, and blocking a charge at high temperature, among others. In one example, reducing the charge rate may reduce an amount of time to recharge a rechargeable battery. In a second example, lowering the top of charge voltage may require a programmable maximum voltage in a charger. In another example, lowering the top of charge voltage may require battery crossing temperature based charge voltage threshold after a higher charge voltage was established.

In one or more embodiments, configuring charge termination current may be utilized. In one example, configuring charge termination current may reduce a temperature of a rechargeable battery while the rechargeable battery is being charged. In a second example, configuring charge termination current may reduce rechargeable battery wear out. In a third example, configuring charge termination current may reduce gas generation while the rechargeable battery is being charged, which may reduce battery swelling. In another example, configuring charge termination current may reduce an overall charge time. In one or more embodiments, for one or more battery applications and/or topologies, configuring charge termination current may enable a charger to include fewer components and/or reduce a complexity of the charger. For example, the charger may not include or may not be configured with a programmable voltage.

In one or more embodiments, configuring charge termination current may include utilizing a lookup table. For example, a battery management unit of a rechargeable battery may include the lookup table. For instance, the battery management unit may determine a value for a charge termination current parameter based at least on a present temperature value associated with the rechargeable battery. In one or more embodiments, a charge rate of a rechargeable cell of a rechargeable battery and/or a discharge rate of the rechargeable cell may be governed by a C-rate. For example, a capacity of a rechargeable cell may be commonly rated at 1 C, which may mean that a fully charged rechargeable cell rated at 1 Ah (one ampere-hour or "amp-hour") should provide 1 A (one ampere or "amp") for one hour. In one instance, the rechargeable cell discharging at 0.5 C may provide 0.5 A (500 milliamperes or "milliamps") for two hours. In another instance, the rechargeable cell discharging at 2 C may provide 2 A (two amperes or "amps") for one half hour. In one or more embodiments, a rechargeable cell may be charged and discharged above 1 C.

In one or more embodiments, losses at fast discharges may reduce a discharge time associated with a rechargeable cell. For example, these losses may also affect charge times. In one or more embodiments, a top of charge voltage value may be 4.3V (4.3 volts). For example, when a charger utilizes the top of charge voltage value, the charger may maintain top of charge voltage value and taper electrical current to the cell as an amount of charging time increases.

In one or more embodiments, a top of charge voltage value may be associated with a temperature associated with a rechargeable cell. For example, a top of charge voltage value may be associated with a temperature range. For instance, multiple top of charge voltage values may be associated with respective temperature ranges associated with the rechargeable cell. As one example, a first top of charge voltage value may be associated with a first temperature range. As a second example, a second top of charge voltage value may be associated with a second temperature range. As a second example, a third top of charge voltage value may be associated with a third temperature range. When a temperature value associated with the rechargeable cell is within the first temperature range, the first top of charge voltage value may be utilized in charging the cell. When a temperature value associated with the rechargeable cell is within the second temperature range, the second top of charge voltage value may be utilized in charging the rechargeable cell. When a temperature value associated with the rechargeable cell is within the third temperature range, the third top of charge voltage value may be utilized in charging the rechargeable cell.

In one or more embodiments, a charge voltage value of 4.4V (4.4 volts) may be utilized in charging the rechargeable cell, and when a charge current value reaches 0.4 C, charging of the rechargeable cell may cease. For example, when charging of the rechargeable cell ceases at 0.4 C, this may reduce an exposure of the cell to a charging time and/or an elevated temperature. For instance, a total charge time may be reduced or may achieve similar charge time with a combination of lowered bulk charging current and temperature compensated charge termination current.

In one or more embodiments, a top of charge voltage value may be associated with a temperature associated with a rechargeable cell. For example, a single top of charge voltage value may be utilized during charging while a charge current may be varied based at least on a temperature associated with the rechargeable cell or based at least on a temperature range associated with the rechargeable cell. For instance, multiple charge current values may be utilized with respective temperature ranges associated with the rechargeable cell. As one example, a first charge current value may be associated with a first temperature range. As a second example, a second charge current value may be associated with a second temperature range. As a third example, a third charge current value may be associated with a third temperature range. When a temperature value associated with the rechargeable cell is within the first temperature range, the first charge current value may be utilized in charging the rechargeable cell. When a temperature value associated with the rechargeable cell is within the second temperature range, the second charge current value may be utilized in charging the rechargeable cell. When a temperature value associated with the rechargeable cell is within the third temperature range, the third charge current value may be utilized in charging the rechargeable cell. In one or more embodiments, when a charge current value reaches a threshold charge current value, charging of the rechargeable cell may cease.

Turning now to FIG. 1A, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, a mobile IHS 110 may be a portable IHS 110. For example, IHS 110 may be a mobile IHS 110.

In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, an embedded controller (EC) 130, a volatile memory medium 150, non-volatile memory media 160 and 170, an I/O subsystem 175, and a network interface 180. As illustrated, EC 130, volatile memory medium 150, non-volatile memory media 160 and 170, I/O subsystem 175, and network interface 180 may be communicatively coupled to processor 120.

In one or more embodiments, one or more of EC 130, volatile memory medium 150, non-volatile memory media 160 and 170, I/O subsystem 175, and network interface 180 may be communicatively coupled to processor 120 via one or more buses, one or more switches, and/or one or more root complexes, among others. In one example, one or more of EC 130, volatile memory medium 150, non-volatile memory media 160 and 170, I/O subsystem 175, and network interface 180 may be communicatively coupled to processor 120 via one or more PCI-Express (PCIe) root complexes. In another example, one or more of EC 130, I/O subsystem 175, and network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, at least a portion of one or more flowcharts, at least a portion of one or more methods, and/or at least a portion of one or more processes described herein. In one example, processor 120 may execute processor instructions from one or more of memory media 150, 160, and 170 in implementing at least a portion of one or more systems, at least a portion of one or more flowcharts, at least a portion of one or more methods, and/or at least a portion of one or more processes described herein. In another example, processor 120 may execute processor instructions via network interface 180 in implementing at least a portion of one or more systems, at least a portion of one or more flowcharts, at least a portion of one or more methods, and/or at least a portion of one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150, 160, and 170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an ACPI, among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, processor 120 and one or more components of IHS 110 may be included in a system-on-chip (SoC). For example, the SoC may include processor 120 and a platform controller hub (not specifically illustrated).

In one or more embodiments, IHS 110 may include one or more sensors. As illustrated, IHS 110 may include sensors 132A and 132B. Although sensors 132A and 132B are illustrated, IHS 110 may include any number of sensors 132. In one or more embodiments, a sensor 132 may include a temperature sensor. In one example, a sensor 132 may provide an analog signal associated with a temperature at or close to (e.g., within ten millimeters) sensor 132. In one instance, sensor 132 may provide an analog signal via an electrical current signal associated with a temperature at or close to sensor 132. In another instance, sensor 132 may provide an analog signal via an electrical voltage signal associated with a temperature at or close to sensor 132. In another example, a sensor 132 may provide a digital signal associated with a temperature at or close to (e.g., within ten millimeters) sensor 132. For instance, sensor 132 may provide digital data associated with a temperature at or close to sensor 132. In one or more embodiments, a sensor 132 may be coupled to EC 130. In one example, sensor 132 may provide an analog signal associated with a temperature at or close to sensor 132. In another example, sensor 132 may provide a digital signal associated with a temperature at or close to sensor 132.

In one or more embodiments, IHS 110 may include a rechargeable battery 190. In one example, rechargeable battery 190 may store energy. In another example, rechargeable battery 190 may provide power to one or more components of IHS 110. For instance, the one or more components of IHS 110 may include processor 120, EC 130, volatile memory medium 150, non-volatile memory media 160 and 170, I/O subsystem 175, and network interface 180, among others. In one or more embodiments, rechargeable battery 190 may provide power to one or more components external to IHS 110. For example, the one or more components external to IHS 110 may include an external pointing device (e.g., a mouse, a touchpad, etc.), an external keyboard, a drive (e.g., a thumb drive, a portable storage device, etc.), and an external display, among others. In one or more embodiments, rechargeable battery 190 may include one or more rechargeable cells. For example, rechargeable battery 190 may include multiple rechargeable cells. In one instance, two or more of the multiple rechargeable cells may be arranged in series. In a second instance, two or more of the multiple rechargeable cells may be arranged in parallel. In another instance, two or more of the multiple rechargeable cells may be arranged in various combinations of series and parallel.

In one or more embodiments, rechargeable battery 190 may include a battery management unit (BMU) 191. For example, BMU 191 may include an electronic system that manages rechargeable battery 190. For instance, BMU 191 may protect rechargeable battery 190 from operating outside a safe operating area, may determine one or more states associated with rechargeable battery 190 (e.g., state of charge, state of health, state of power, state of safety, etc.), may determine data associated with rechargeable battery 190, may determine data associated with one or more cells of rechargeable battery 190, may report the data associated with rechargeable battery 190, may report the data associated with the one or more cells of rechargeable battery 190, may control an environment associated with rechargeable battery 190, authenticating rechargeable battery 190, and/or may charge balancing two or more cells of rechargeable battery 190, among others.

In one or more embodiments, BMU 191 may be or include a microcontroller. For example, the microcontroller may be configured, coded, and/or encoded with instructions in accordance with at least a portion of one or more of systems, at least a portion of one or more flowcharts, at least a portion of one or more methods, and/or at least a portion of one or more processes described herein. For instance, the microcontroller may be or include an 8051 microcontroller, an ARM Cortex-M (e.g., Cortex-M0, Cortex-M1, Cortex-M3, Cortex-M4, etc.) microcontroller, a MSP430 microcontroller, an AVR (e.g., 8-bit AVR, AVR-32, etc.) microcontroller, a PIC microcontroller, a 68HC11 microcontroller, and a Renesas microcontroller, among others. In one or more embodiments, BMU 191 may be or include one or more of a field programmable gate array (FPGA) and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

In one or more embodiments, a sensor 132 may be physically located within a chassis (e.g., a housing) of IHS 110. For example, sensor 132 may be utilized to determine a temperature value associated with battery 190 and/or may be utilized to determine a temperature value associated with a cell of battery 190. In one instance, sensor 132 may be physically located close to (e.g., within ten millimeters) battery 190. In another instance, sensor 132 may be physically located on battery 190 (e.g., in physical contact with a housing of battery 190).

In one or more embodiments, EC 130 may be or include a remote access controller. For example, the remote access controller may be or include a DELL™ Remote Access Controller (DRAC). In one or more embodiments, a remote access controller may be integrated into IHS 110. For example, the remote access controller may be or include an integrated DELL™ Remote Access Controller (iDRAC). In one or more embodiments, a remote access controller may include one or more of a processor, a memory, and a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. In one example, the remote access controller may be based at least on an Intelligent Platform Management Interface (IPMI) standard. For instance, the remote access controller may allow and/or permit utilization of IPMI out-of-band interfaces such as IPMI Over LAN (local area network). In another example, the remote access controller may be based at least on a Redfish standard. In one instance, one or more portions of the remote access controller may be compliant with one or more portions of a Redfish standard. In another instance, one or more portions of the remote access controller may implement one or more portions of a Redfish standard. In one or more embodiments, a remote access controller may include and/or provide one or more internal private networks. For example, the remote access controller may include and/or provide one or more of an Ethernet interface, a front panel USB interface, and a Wi-Fi interface, among others. In one or more embodiments, a remote access controller may be, include, or form at least a portion of a virtual KVM (keyboard, video, and mouse) device. For example, a remote access controller may be, include, or form at least a portion of a KVM over IP (IPKVM) device. For instance, a remote access controller may capture video, keyboard, and/or mouse signals; may convert the signals into packets; and may provide the packets to a remote console application via a network.

In one or more embodiments, EC 130 may be or include a microcontroller. For example, the microcontroller may be or include an 8051 microcontroller, an ARM Cortex-M (e.g., Cortex-M0, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, EC 130 may be or include an application processor. In one example, EC 130 may be or include an ARM Cortex-A processor. In another example, EC 130 may be or include an Intel Atom processor. In one or more embodiments, EC 130 may be or include one or more of a FPGA and an ASIC, among others, configured, coded, and/or encoded with instructions in accordance with at least a portion of one or more of systems, at least a portion of one or more flowcharts, at least a portion of one or more methods, and/or at least a portion of one or more processes described herein.

Figure 1B:
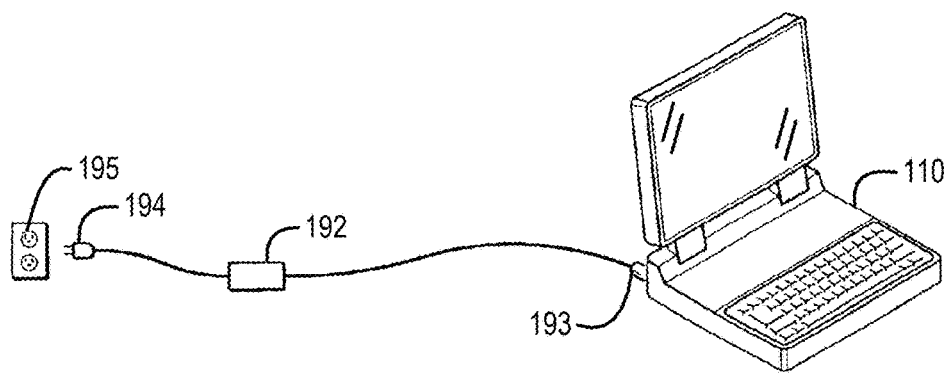
FIG. 1B illustrates another example of an information handling system, according to one or more embodiments.

Turning now to FIG. 1B, another example of an information handling system is illustrated, according to one or more embodiments. In one or more embodiments, IHS 110 may be a mobile information handling system. For example, IHS 110 may be coupled to an external power supply 192. In one instance, IHS 110 may receive power from external power supply 192 to power one or more components of IHS 110. In another instance, IHS 110 may receive power from external power supply 192 to charge rechargeable battery 190.

In one or more embodiments, IHS 110 may be coupled to external power supply 192 via a plug 193. In one or more embodiments, external power supply 192 may be coupled to a plug 194. For example, plug 194 may be plugged into a receptacle 195. For instance, receptacle 195 may be a wall receptacle, which may provide alternating current (AC) to power supply 192. In one or more embodiments, external power supply 192 may receive AC power via plug 194 from plug 195. For example, external power supply 192 may provide direct current (DC) power to IHS 110 via plug 193.

Figure 2A:
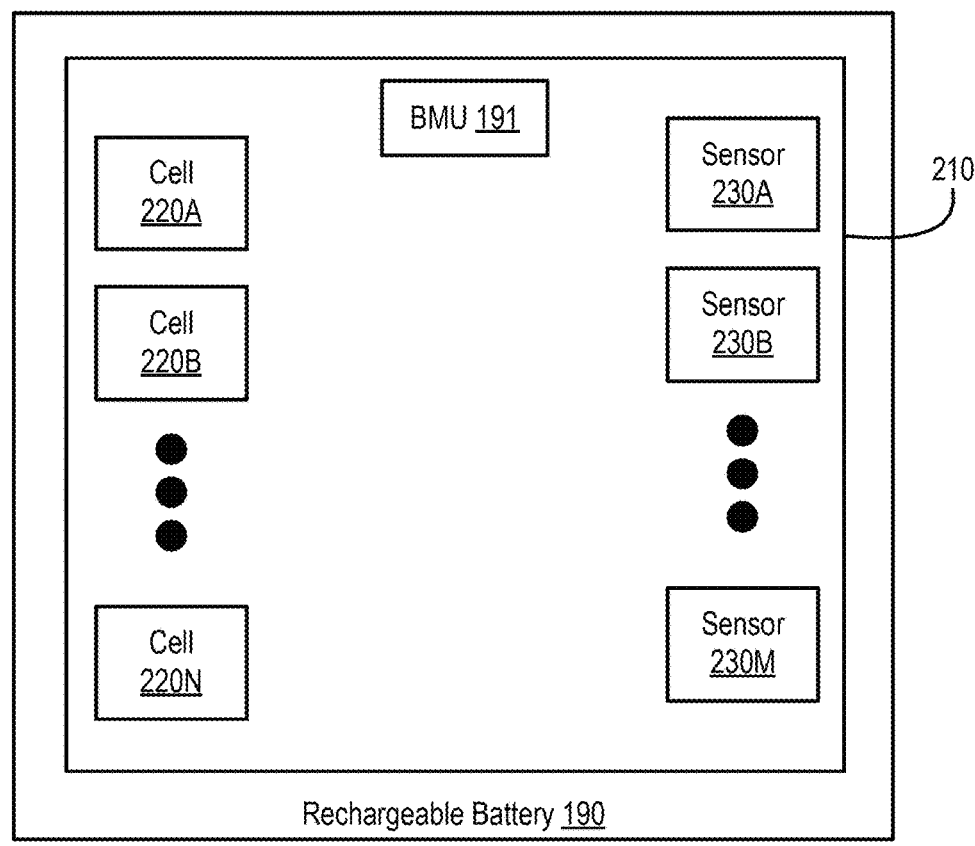
FIG. 2A illustrates an example of a rechargeable battery, according to one or more embodiments.

Turning now to FIG. 2A, an example of a rechargeable battery is illustrated, according to one or more embodiments. In one or more embodiments, rechargeable battery 190 may include a housing 210. In one or more embodiments, rechargeable battery 190 may include multiple rechargeable cells. For example, rechargeable battery 190 may include rechargeable cells 220A-220N. Although rechargeable battery 190 is illustrated as including rechargeable cells 220A-220N, rechargeable battery 190 may include any number of rechargeable cells. In one or more embodiments, rechargeable cells 220A-220N may be arranged in various topologies. In one example, a first portion of rechargeable cells 220A-220N may be arranged in series. In another example, a second portion of rechargeable cells 220A-220N may be arranged in parallel. In one or more embodiments, combinations of series and parallel arrangements of rechargeable cells 220A-220N may be utilized. For example, rechargeable battery 190 may be configured with one or more combinations of series and parallel arrangements of rechargeable cells 220A-220N to implement a design for rechargeable battery 190.

In one or more embodiments, rechargeable battery 190 may include one or more sensors. As illustrated, rechargeable battery 190 may include sensors 230A-230M. Although sensors 230A-230M are illustrated, rechargeable battery 190 may include any number of sensors 230. In one or more embodiments, a sensor 230 may include a temperature sensor. In one example, a sensor 230 may provide an analog signal associated with a temperature at or close to (e.g., within ten millimeters) sensor 230. In one instance, sensor 230 may provide an analog signal via an electrical current signal associated with a temperature at or close to sensor 230. In another instance, sensor 230 may provide an analog signal via an electrical voltage signal associated with a temperature at or close to sensor 230. In another example, a sensor 230 may provide a digital signal associated with a temperature at or close to (e.g., within ten millimeters) sensor 230. For instance, sensor 230 may provide digital data associated with a temperature at or close to sensor 230. In one or more embodiments, a sensor 230 may be coupled to BMU 191. In one example, sensor 230 may provide an analog signal associated with a temperature at or close to sensor 230. In another example, sensor 230 may provide a digital signal associated with a temperature at or close to sensor 230. In one or more embodiments, a sensor 230 may be communicatively coupled to BMU 191.

In one or more embodiments, a sensor 230 may be physically located within housing 210. For example, sensor 230 may be utilized to determine a temperature value associated with battery 190 and/or may be utilized to determine a temperature value associated with a rechargeable cell 220. In one instance, sensor 230 may be physically located close to (e.g., within ten millimeters) rechargeable cell 220. In another instance, sensor 230 may be physically located on rechargeable cell 220 (e.g., in physical contact with a housing of rechargeable cell 220). In one or more embodiments, a sensor 230 may be in physical contact with one or more of rechargeable cells 220A-220N.

In one or more embodiments, a rechargeable cell 220 may include a material that is utilized to store chemical energy. In one example, the stored chemical energy may be converted into electrical energy (e.g., discharging rechargeable cell 220). In another example, rechargeable cell 220 may receive electrical energy, and the material may store the received electrical energy as chemical energy (e.g., charging rechargeable cell 220). In one or more embodiments, the material of rechargeable cell 220 may include lithium cobalt oxide ($LiCoO_2$), lithium manganese oxide ($LiMn_2O_4$), lithium nickel manganese cobalt oxide ($LiNiMnCoO_2$), lithium iron phosphate($LiFePO_4$), lithium nickel cobalt aluminum oxide ($LiNiCoAlO_2$), or lithium titanate ($Li_2TiO_3$), among others.

Figure 2B:
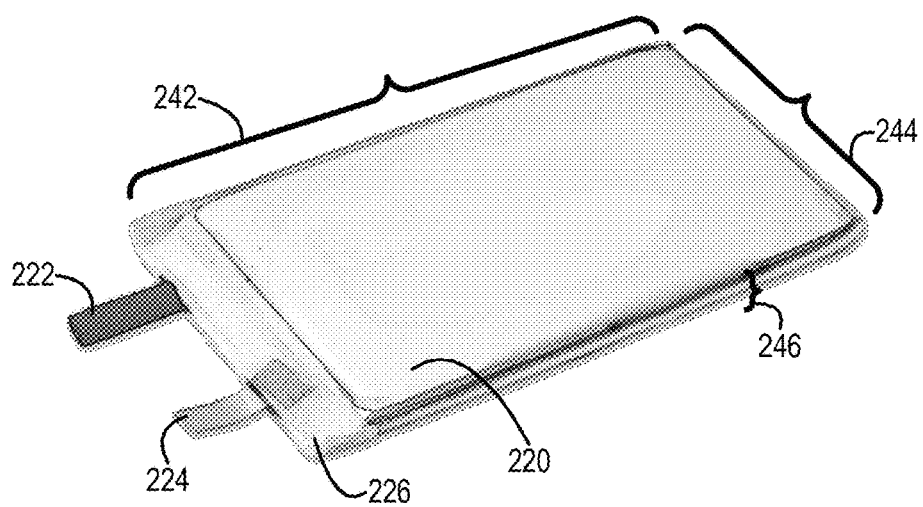
FIG. 2B illustrates an example of a rechargeable cell, according to one or more embodiments.

Turning now to FIG. 2B, an example of a rechargeable cell is illustrated, according to one or more embodiments. In one or more embodiments, rechargeable cell 220 may include a positive terminal 222 and a negative terminal 224. In one or more embodiments, rechargeable cell 220 may include a housing 226. For example, housing 226 may include an electrically non-conductive material. For instance, housing 226 may include bag or pouch, which may be made of an electrically non-conductive material.

In one or more embodiments, housing 226 may be associated with a length 242, a width 244, and a height 246. In the example illustrated in FIG. 2B, rechargeable cell 220 may be prismatic in shape. In one or more embodiments, rechargeable cell 220 may have any shape. In one or more embodiments, one or more of length 242, width 244, and height 246 may increase if rechargeable cell 220 generates one or more gases when charging or discharging. For example, a volume of housing 226 may increase if rechargeable cell 220 generates one or more gases when charging and/or discharging. For instance, height 246 may increase if rechargeable cell 220 generates one or more gases when charging and/or discharging. In one or more embodiments, increases in height 246 may vary across one or more of length 242 and width 244. For example, the increases in height 246 across one or more of length 242 and width 244 may appear as one or more bulges of housing 226.

In one or more embodiments, if a volume of housing 226 increases, damage may occur. In one example, if a volume of housing 226 increases, damage may occur to rechargeable cell 220. In a second example, if a volume of housing 226 increases, damage may occur to an adjacent rechargeable cell 220. In a third example, if a volume of housing 226 increases, damage may occur to rechargeable battery 190. In a fourth example, if a volume of housing 226 increases, damage may occur to a component of IHS 110. For instance, a component of IHS 110 may include processor 120, EC 130, sensor 132A, sensor 132B, volatile memory medium 150, non-volatile memory media 160 and 170, I/O subsystem 175, network interface 180, a keyboard of IHS 110, a touchpad of IHS 110, or a chassis of IHS 110, among others. In another example, if a volume of housing 226 increases, damage may occur to IHS 110.

Figure 3:
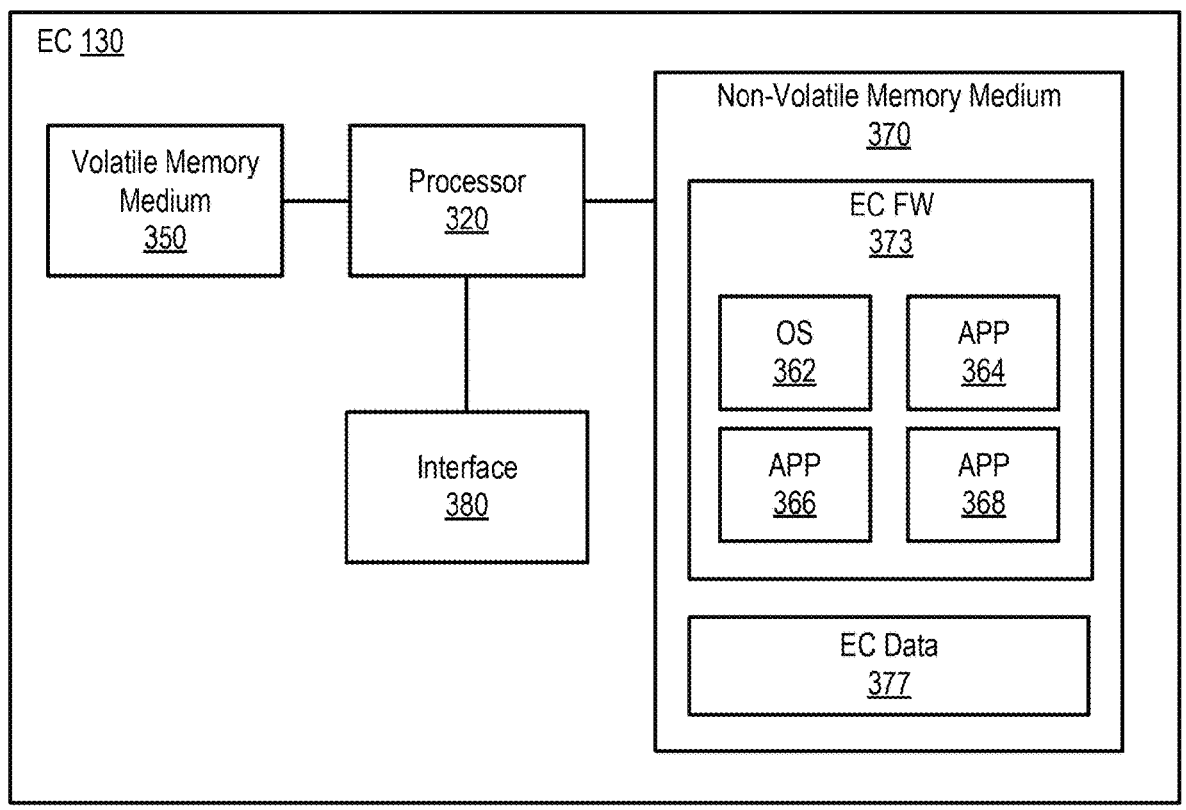
FIG. 3 illustrates an example of an embedded controller, according to one or more embodiments.

Turning now to FIG. 3, an example of an embedded controller is illustrated, according to one or more embodiments. As shown, EC 130 may include a processor 320, a volatile memory medium 350, a non-volatile memory medium 370, and an interface 380. As illustrated, non-volatile memory medium 370 may include an EC firmware (FW) 373, which may include an OS 362 and APPs 364-368, and may include EC data 377. In one example, OS 362 may be or include a real-time operating system (RTOS). For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 362 may be or include an Unix-like operating system. For instance, the Unix-like operating system may be or include LINUX®, FREEBSD®, NETBSD®, OpenBSD, Minix, Xinu, or Darwin, among others. In another example, OS 362 may be or include a portable operating system interface (POSIX) compliant operating system.

In one or more embodiments, interface 380 may include circuitry that enables communicatively coupling to one or more devices. In one example, interface 380 may include circuitry that enables communicatively coupling to one or more buses. For instance, the one or more buses may include one or more buses described herein, among others. In a second example, interface 380 may include circuitry that enables one or more interrupt signals to be received. In one instance, interface 380 may include general purpose input/output (GPIO) circuitry, and the GPIO circuitry may enable one or more interrupt signals to be received and/or provided via at least one interrupt line. In another instance, interface 380 may include GPIO circuitry that may enable EC 130 to provide and/or receive signals associated with other circuitry (e.g., diagnostic circuitry, etc.). In a third example, interface 380 may include circuitry that enables communicatively coupling to one or more networks. In one instance, interface 380 may include circuitry that enables communicatively coupling to network interface 180. In another example, interface 380 may include a network interface.

In one or more embodiments, one or more of OS 362 and APPs 364-368 may include processor instructions executable by processor 320. In one example, processor 320 may execute processor instructions of one or more of OS 362 and APPs 364-368 via non-volatile memory medium 370. In another example, one or more portions of the processor instructions of the one or more of OS 362 and APPs 364-368 may be transferred to volatile memory medium 350, and processor 320 may execute the one or more portions of the processor instructions of the one or more of OS 362 and APPs 364-368 via volatile memory medium 350. In one or more embodiments, processor 320 may execute instructions in accordance with at least a portion of one or more systems, at least a portion of one or more flowcharts, one or more methods, and/or at least a portion of one or more processes described herein. For example, non-volatile memory medium 370 and/or volatile memory medium 350 may store instructions that may be executable in accordance with at least a portion of one or more systems, at least a portion of one or more flowcharts, at least a portion of one or more methods, and/or at least a portion of one or more processes described herein. In one or more embodiments, processor 320 may execute instructions in accordance with at least a portion of one or more of systems, flowcharts, at least a portion of one or more methods, and/or at least a portion of one or more processes described herein. For example, non-volatile memory medium 370 and/or volatile memory medium 350 may store instructions that may be executable in accordance with at least a portion of one or more of systems, at least a portion of one or more flowcharts, at least a portion of one or more methods, and/or at least a portion of one or more processes described herein. In one or more embodiments, processor 320 may utilize EC data 377. In one example, processor 320 may utilize EC data 377 via non-volatile memory medium 370. In another example, one or more portions of EC data 377 may be transferred to volatile memory medium 350, and processor 320 may utilize EC data 377 via volatile memory medium 350.

Figure 4:
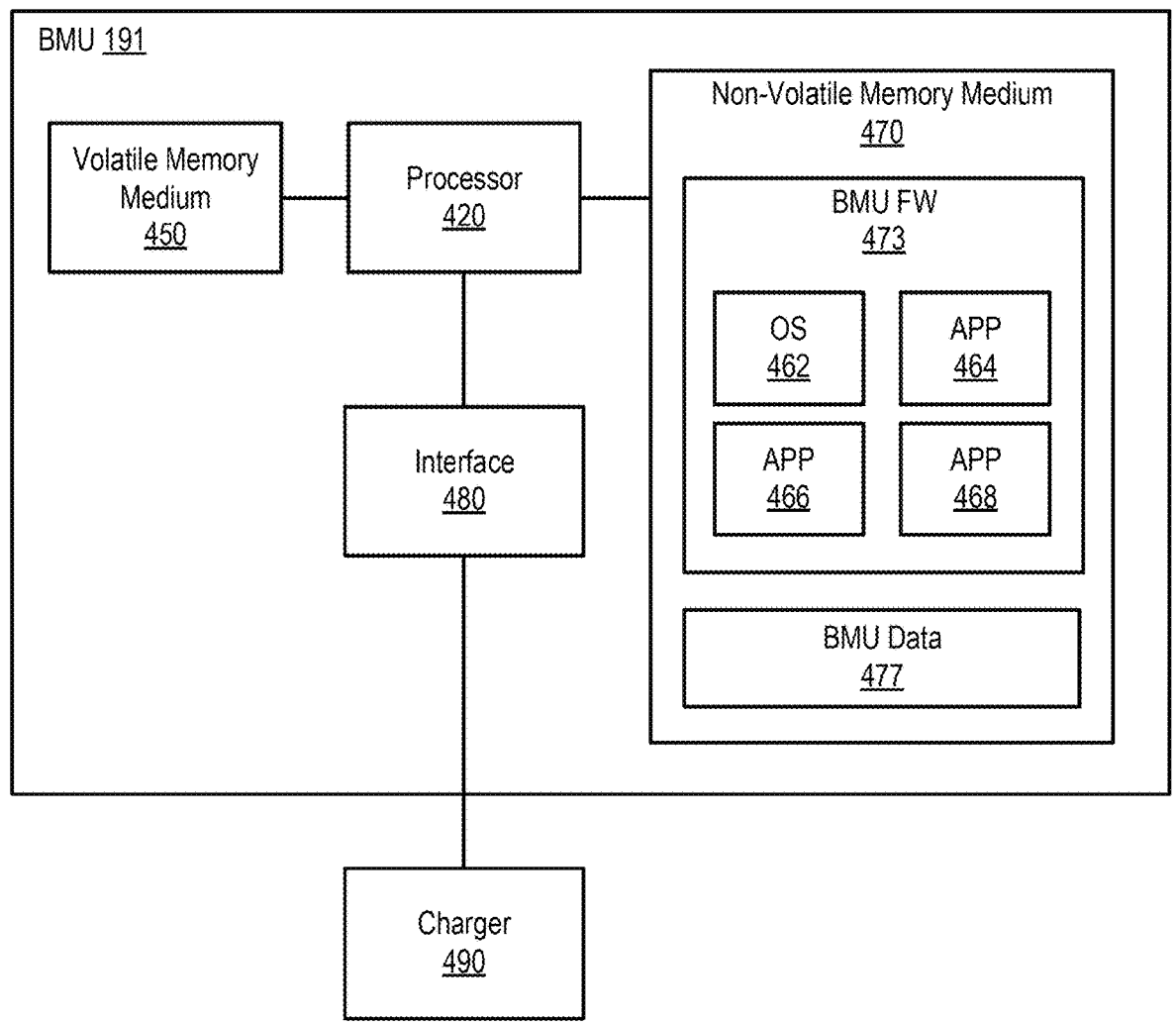
FIG. 4 illustrates an example of a battery management unit, according to one or more embodiments.

Turning now to FIG. 4, an example of a battery management unit is illustrated, according to one or more embodiments. As shown, BMU 191 may include a processor 420, a volatile memory medium 450, a non-volatile memory medium 470, and an interface 480. As illustrated, non-volatile memory medium 470 may include a BMU firmware (FW) 473, which may include an OS 462 and APPs 464-468, and may include BMU data 477. In one example, OS 462 may be or include a RTOS. For instance, the RTOS may be or include FreeRTOS, OpenRTOS, SafeRTOS, QNX, ThreadX, VxWorks, NuttX, TI-RTOS, eCos, MicroC/OS, or Zephyr, among others. In a second example, OS 462 may be or include an Unix-like operating system. For instance, the Unix-like operating system may be or include LINUX®, FREEBSD®, NETBSD®, OpenBSD, Minix, Xinu, or Darwin, among others. In another example, OS 462 may be or include a POSIX compliant operating system.

In one or more embodiments, interface 480 may include circuitry that enables communicatively coupling to one or more devices. In one example, interface 480 may include circuitry that enables communicatively coupling to one or more buses. For instance, the one or more buses may include one or more buses described herein, among others. In a second example, interface 480 may include circuitry that enables one or more interrupt signals to be received. In one instance, interface 480 may include GPIO circuitry, and the GPIO circuitry may enable one or more interrupt signals to be received and/or provided via at least one interrupt line. In another instance, interface 480 may include GPIO circuitry that may enable BMU 191 to provide and/or receive signals associated with other circuitry (e.g., diagnostic circuitry, etc.). In a third example, interface 480 may include circuitry that enables communicatively coupling to one or more networks. In one instance, interface 480 may include circuitry that enables communicatively coupling to network interface 180. In another example, interface 480 may include a network interface.

In one or more embodiments, one or more of OS 462 and APPs 464-468 may include processor instructions executable by processor 420. In one example, processor 420 may execute processor instructions of one or more of OS 462 and APPs 464-468 via non-volatile memory medium 470. In another example, one or more portions of the processor instructions of the one or more of OS 462 and APPs 464-468 may be transferred to volatile memory medium 450, and processor 420 may execute the one or more portions of the processor instructions of the one or more of OS 462 and APPs 464-468 via volatile memory medium 450. In one or more embodiments, processor 420 may execute instructions in accordance with at least a portion of one or more systems, at least a portion of one or more flowcharts, one or more methods, and/or at least a portion of one or more processes described herein. For example, non-volatile memory medium 470 and/or volatile memory medium 450 may store instructions that may be executable in accordance with at least a portion of one or more systems, at least a portion of one or more flowcharts, at least a portion of one or more methods, and/or at least a portion of one or more processes described herein. In one or more embodiments, processor 420 may execute instructions in accordance with at least a portion of one or more of systems, flowcharts, at least a portion of one or more methods, and/or at least a portion of one or more processes described herein. For example, non-volatile memory medium 470 and/or volatile memory medium 450 may store instructions that may be executable in accordance with at least a portion of one or more of systems, at least a portion of one or more flowcharts, at least a portion of one or more methods, and/or at least a portion of one or more processes described herein. In one or more embodiments, processor 420 may utilize BMU data 477. In one example, processor 420 may utilize BMU data 477 via non-volatile memory medium 470. In another example, one or more portions of BMU data 477 may be transferred to volatile memory medium 450, and processor 420 may utilize BMU data 477 via volatile memory medium 450.

In one or more embodiments, interface 480 may be coupled to a charger 490 (e.g., a rechargeable battery charger). For example, charger 490 may charge cells 220A-220N. In one or more embodiments, BMU 191 may control charger 490. For example, charger 490 may include a configurable current source. For instance, BMU 191 may control the configurable current source of charger 490 to set a charge current for a rechargeable cell 220. In one or more embodiments, the configurable current source may include an electronic circuit that delivers an electric current to a load that is independent of a voltage across the load. In one example, the configurable current source may an electric current to a rechargeable cell 220 that is independent of a voltage across rechargeable cell 220. For instance, the configurable current source may an electric current to rechargeable cell 220, based at least on a temperature value associated with rechargeable cell 220, that is independent of a voltage across rechargeable cell 220. In another example, the configurable current source may an electric current to rechargeable battery 190 that is independent of a voltage across rechargeable battery 190. In one or more embodiments, IHS 110 may include charger 490. In one example, rechargeable battery 190 may include charger 490. In another example, BMU 191 may include charger 490.

Figure 5:
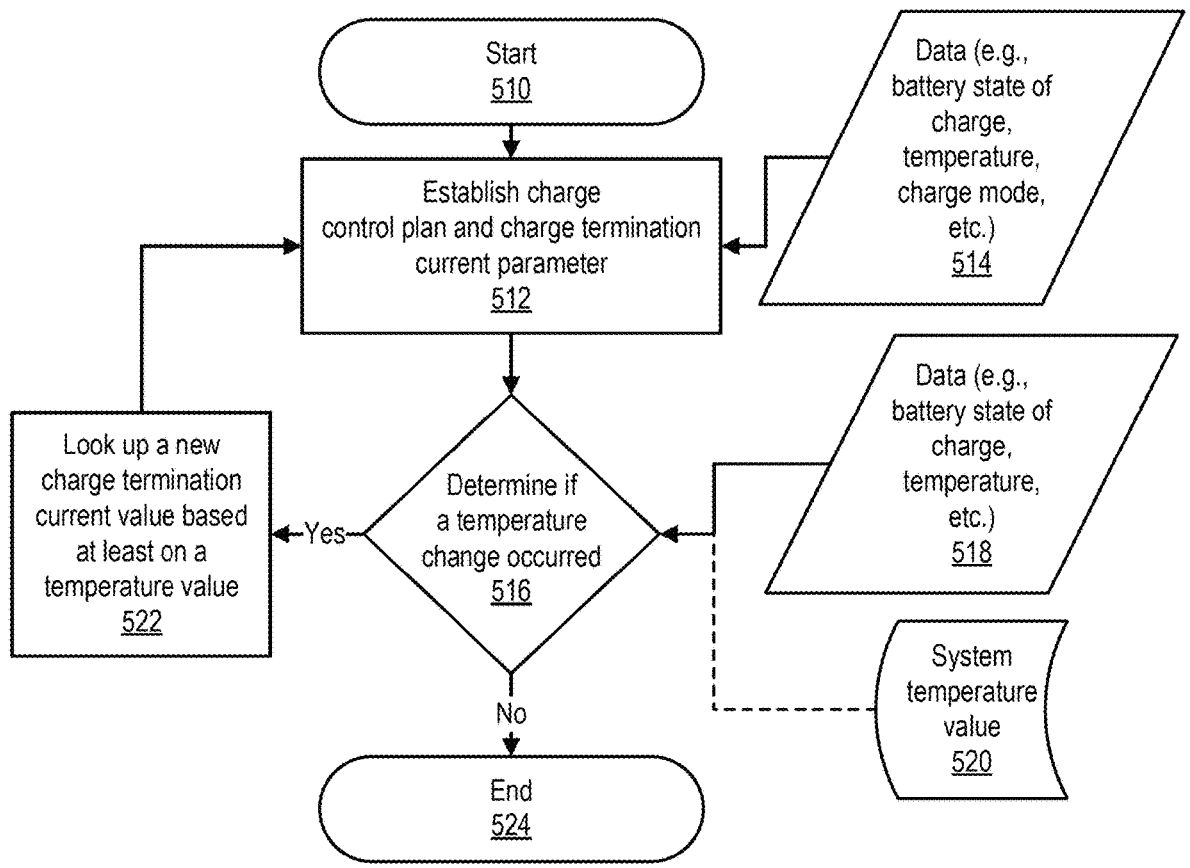
FIG. 5 illustrates an example of a method of charging a rechargeable battery, according to one or more embodiments.

Turning now to FIG. 5, an example of a method of charging a rechargeable battery is illustrated, according to one or more embodiments. At 510, the method may start. At 512, a charge control plan and a charge termination current parameter may be established. In one or more embodiments, data 514 may be received. For example, data 514 may include one or more a state of charge of rechargeable battery 190, a temperature value associated with rechargeable battery 190, and a charge mode associated with rechargeable battery 190, among others. For instance, EC 130 may receive data 514 from BMU 191.

In one or more embodiments, a charge control plan and a charge termination current parameter may be established based at least on a temperature value associated with a rechargeable battery. In one or more embodiments, the temperature value associated with the rechargeable battery may be received from a temperature sensor. In one example, the temperature sensor may be physically located in physical contact with the rechargeable battery. In a second example, the temperature sensor may be physically located near the rechargeable battery (e.g., within ten millimeters of the rechargeable battery). In another example, the temperature sensor may be physically located within the rechargeable battery. In one or more embodiments, the charge termination current parameter may be established based at least on the temperature value associated with the rechargeable battery. In one example, EC 130 may establish the charge control plan. For instance, EC 130 may provide one or more of the charge control plan and the temperature value associated with the rechargeable battery, among others, to BMU 191. In another example, BMU 191 may establish the charge control plan.

At 516, it may be determined if a temperature change associated with the rechargeable battery has occurred. In one example, EC 130 may determine if a temperature change associated with rechargeable battery 190 has occurred. In another example, BMU 191 may determine if a temperature change associated with rechargeable battery 190 has occurred. In one or more embodiments, determining if the temperature change associated with the rechargeable battery has occurred may be based at least on data 518 and/or based at least on an information handling system temperature value 520. For example, data 518 may include one or more a state of charge of rechargeable battery 190 and a temperature value associated with rechargeable battery 190, among others.

If the temperature change associated with the rechargeable battery has not occurred, the method may end at 524. If the temperature change associated with the rechargeable battery has occurred, a new charge termination current value may be looked up based at least on a temperature value associated with the rechargeable battery. In one example, EC 130 may look up a new charge termination current value based at least on a temperature value associated with rechargeable battery 190. For instance, EC 130 may look up a new charge termination current value from a lookup table based at least on a temperature value associated with rechargeable battery 190. In another example, BMU 191 may look up a new charge termination current value based at least on a temperature value associated with rechargeable battery 190. For instance, BMU 191 may look up a new charge termination current value from a lookup table based at least on a temperature value associated with rechargeable battery 190.

In one or more embodiments, the new charge termination current value may be retrieved from a lookup table. For example, the lookup table may include temperature values and respectively associated charge termination current values. In one instance, EC 130 may store the lookup table. In another instance, BMU 191 may store the lookup table. In one or more embodiments, the lookup table may include ranges of temperature values that are respectively associated charge termination current values. For example, if a temperature falls within a range of temperature values a respectively associated charge termination current value may be utilized. For instance, charge termination current values associated with temperature value ranges shown in FIG. 6C may be utilized. In one or more embodiments, the method may proceed to 512, where a charge control plan may be established utilizing the new charge termination current value as the charge termination current parameter.

Figure 6A:
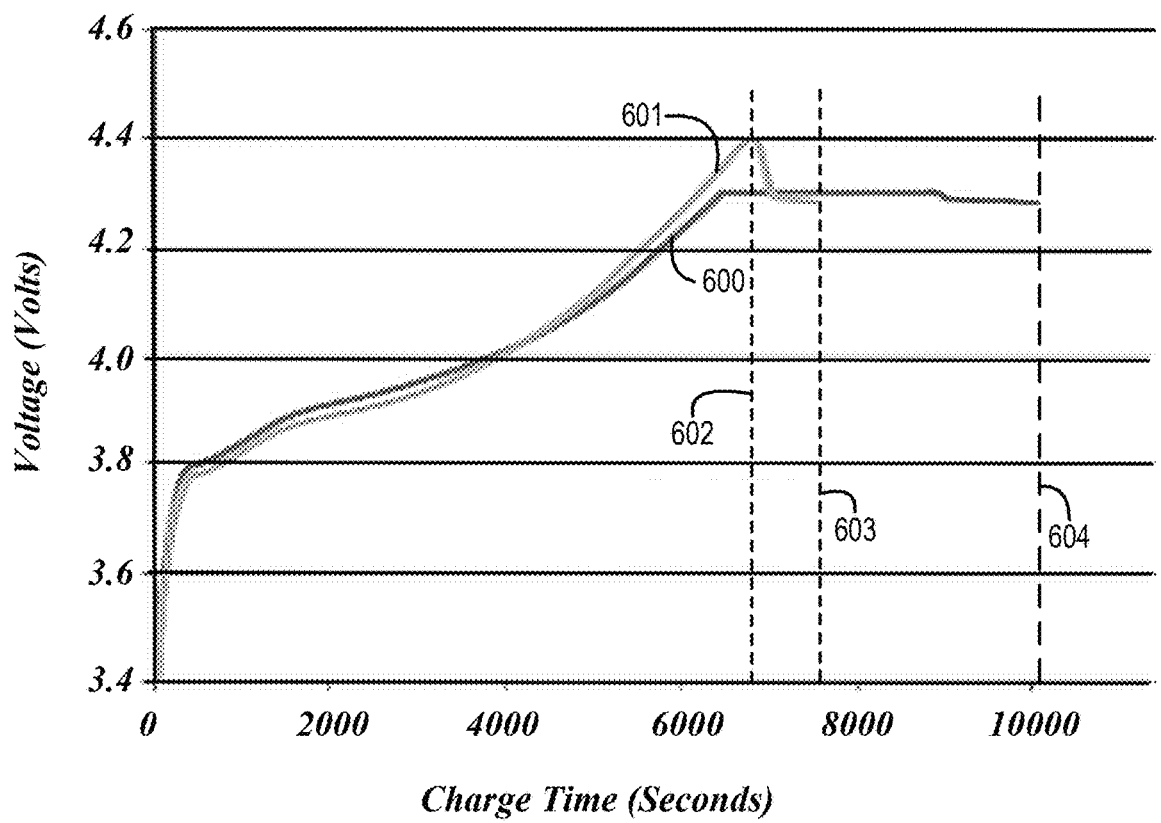
FIG. 6A illustrates examples of plots of charge voltage values, according to one or more embodiments.

Turning now to FIG. 6A, examples of plots of charge voltage values are illustrated, according to one or more embodiments. In one or more embodiments, a plot 600 may illustrate an example of voltage values versus time associated with a legacy charging process. For example, the legacy charging process may vary a top of charge voltage value based at least on temperature. For instance, the legacy charging process may set a top of charge voltage value of 4.3V, which is lower than a standard charging voltage of 4.4V and may continue charging until charging current tapers to 0.05 C. In one or more embodiments, a plot 601 may illustrate an example of voltage values versus time associated with a charging method described herein. For example, when the charging method reaches a top of charge voltage value of 4.4V, at a time 602, and the rechargeable cell may continue to charge in constant voltage mode, with an associated current taper. For instance, a taper current termination value may be determined based at least on a temperature value associated with the rechargeable cell. In one or more embodiments, a charge termination taper current of 0.4 C may be selected for the rechargeable cell. For example, one or more charging methods described herein may apply a taper charge current that is nearly a magnitude higher than the legacy charging process.

Figure 6B:
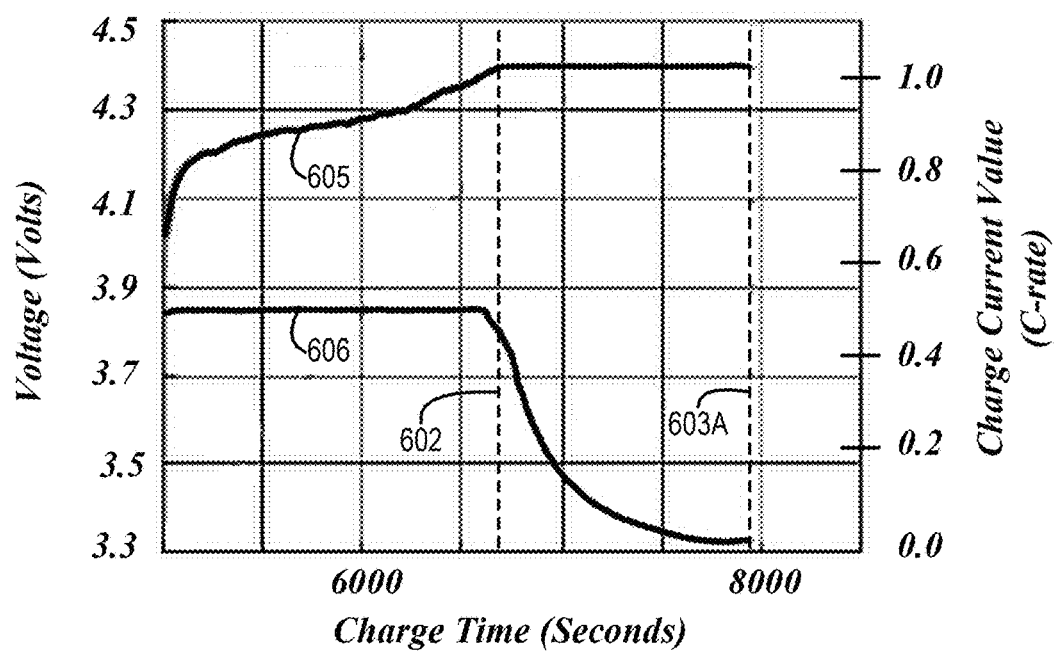
FIG. 6B illustrates example of plots of charge voltage values and taper current values, according to one or more embodiments.

Turning now to FIG. 6B, example of plots of charge voltage values and taper current values are illustrated, according to one or more embodiments. In one or more embodiments, a plot 605 of voltage values of a rechargeable cell versus time may illustrate when the rechargeable cell reaches a top of charge voltage value of 4.4V. For example, the rechargeable cell may reach the top of charge voltage value of 4.4V at time 602. In one or more embodiments, a plot 606 of current values of the rechargeable cell versus time may illustrate when charging current applied to the rechargeable cell starts to taper. For example, the charging current applied to the rechargeable cell may start to taper at time 602. For instance, when the rechargeable cell reaches the top of charge voltage value of 4.4V, a charge current value may be tapered over time. In one or more embodiments, charging of the rechargeable cell may be terminated when the charge current value is at or below a charge termination current value. For example, the charge current value may be at or below the charge termination current value at a time 603A. For instance, the charge termination current value may be determined based at least on a temperature value associated with the rechargeable cell.

Figure 6C:
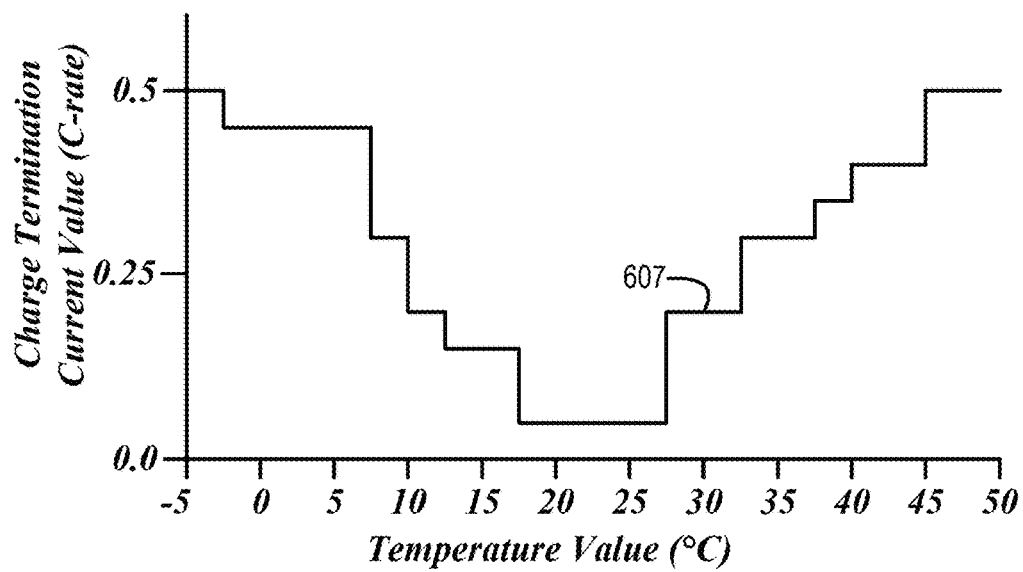
FIG. 6C illustrates an example of a plot of charge termination current values versus temperature values, according to one or more embodiments.

Turning now to FIG. 6C, an example of a plot of charge termination current values versus temperature values is illustrated, according to one or more embodiments. A plot 607 may illustrate an example of charge termination current values associated with temperature value ranges, according to one or more embodiments. In one or more embodiments, plot 607 may illustrate charge termination current values of a lookup table. In one example, a charge termination current value may be determined from a temperature value. In another example, a charge termination current value may be determined from a temperature value range.

Figure 6D:
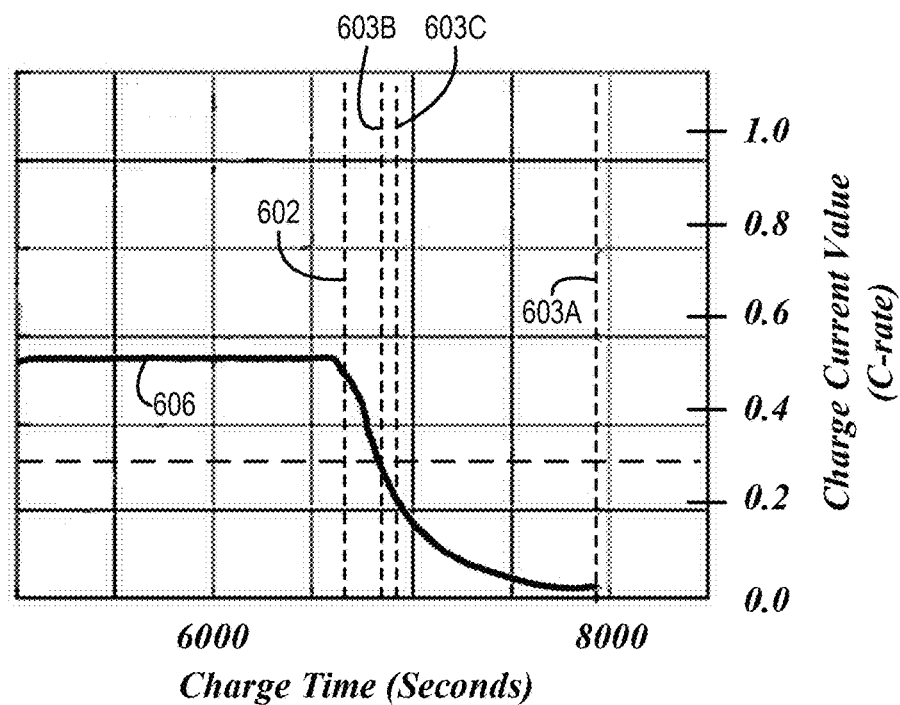
FIG. 6D illustrates examples charge terminations, according to one or more embodiments.

Turning now to FIG. 6D, examples charge terminations are illustrated, according to one or more embodiments. As an example, a charge termination current value may be 0.3 C. In one instance, a temperature value associated with a cell 220 may be 8° C., and based at least on the charge termination current values illustrated in FIG. 6C, the charge termination current value may be determined as 0.3 C. In a second instance, a temperature value associated with cell 220 may be within a temperature range of 7.5° C. to 10° C., and based at least on the charge termination current values illustrated in FIG. 6C, the charge termination current value may be determined as 0.3 C. In a third instance, a temperature value associated with cell 220 may be 34° C., and based at least on the charge termination current values illustrated in FIG. 6C, the charge termination current value may be determined as 0.3 C. In another instance, a temperature value associated with cell 220 may be within a temperature range of 32.5° C. to 37.5° C., and based at least on the charge termination current values illustrated in FIG. 6C, the charge termination current value may be determined as 0.3 C.

In the example of FIG. 6D, when a charge current value is at 0.3 C, charging of cell 220 may cease. As illustrated, when plot 606 of current values is at 0.3 C charging of cell 220 may cease at a time 603B. Although plot 606 is shown to extend, in time, past time 603B, plot 606 illustrates charge current values for various examples. In one or more embodiments, a charge current value may be determined multiple times. For example, a charge current value may be determined periodically. For instance, when a charge current value may be determined multiple times, the charge current value may not match a charge termination current value. In one or more embodiments, charging of cell 220 may occur when the charge current value is determined to be below the charge termination current value. In the example of FIG. 6D, when the charge current value is below 0.3 C, charging of cell 220 may cease. For instance, the charge current value may be determined at a time 603C. Although plot 606 is shown to extend, in time, past time 603C, plot 606 illustrates charge current values for various examples. In the example of FIG. 6D, the charge current value may be 0.2 at time 603C as shown by plot 606 of current values. For instance, charging of cell 220 may cease at time 603C, when the charge current value may be 0.2, which is below 0.3 C.

Figure 6E:
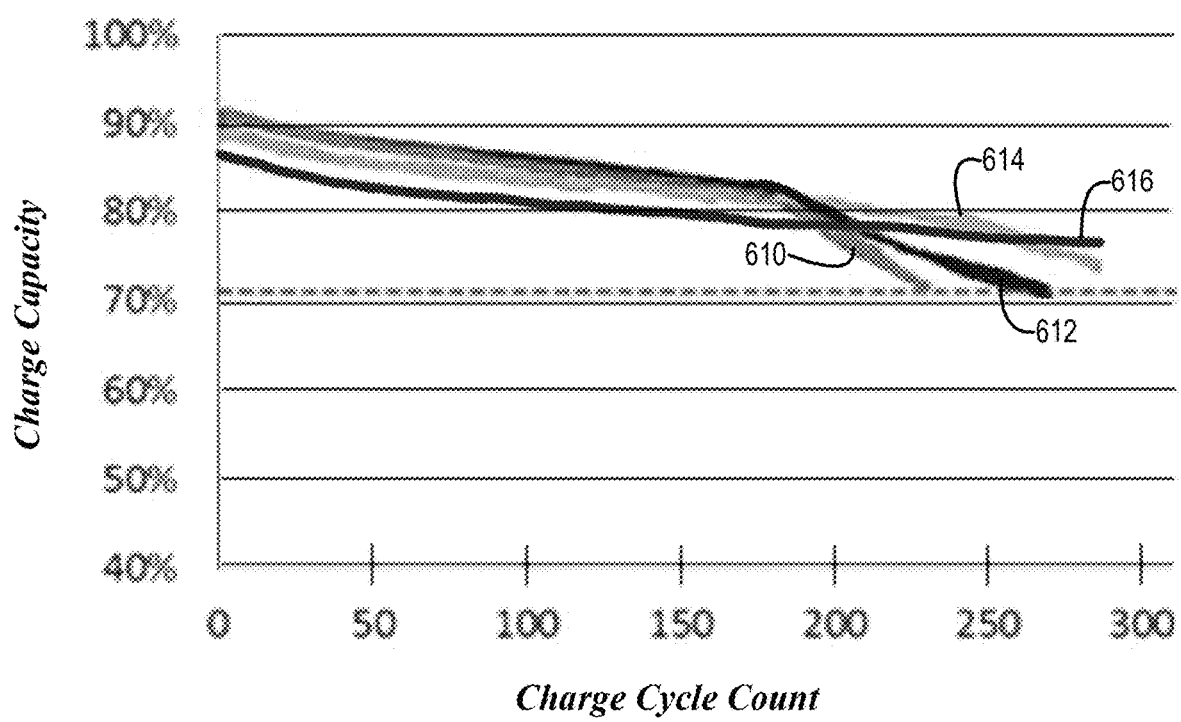
FIG. 6E illustrates example plots of charge capacities of a rechargeable battery associated with various charge termination current values, according to one or more embodiments.

Turning now to FIG. 6E, example plots of charge capacities of a rechargeable battery associated with various charge termination current values are illustrated, according to one or more embodiments. In one or more embodiments, plots 610-616 may illustrate charge capacity percentages associated with numbers of charge cycles. In one example, plot 610 illustrates charge capacity percentages associated with numbers of charge cycles with a top of charge of 4.4V and a C-rate of 0.3 C. In a second example, plot 612 illustrates charge capacity percentages associated with numbers of charge cycles with a top of charge of 4.3V and a C-rate of 0.05 C. In a third example, plot 614 illustrates charge capacity percentages associated with numbers of charge cycles with a top of charge of 4.4V and a C-rate of 0.4 C. In another example, plot 616 illustrates charge capacity percentages associated with numbers of charge cycles with a top of charge of 4.4 V and a C-rate of 0.5 C. As shown, plot 616 illustrates a best capacity as a number of charge cycles increases. For example, plot 616 illustrates a best capacity as a number of charge cycles increases past a specific number of charge cycles. For instance, this may increase a lifetime of a rechargeable battery.

Figure 6F:
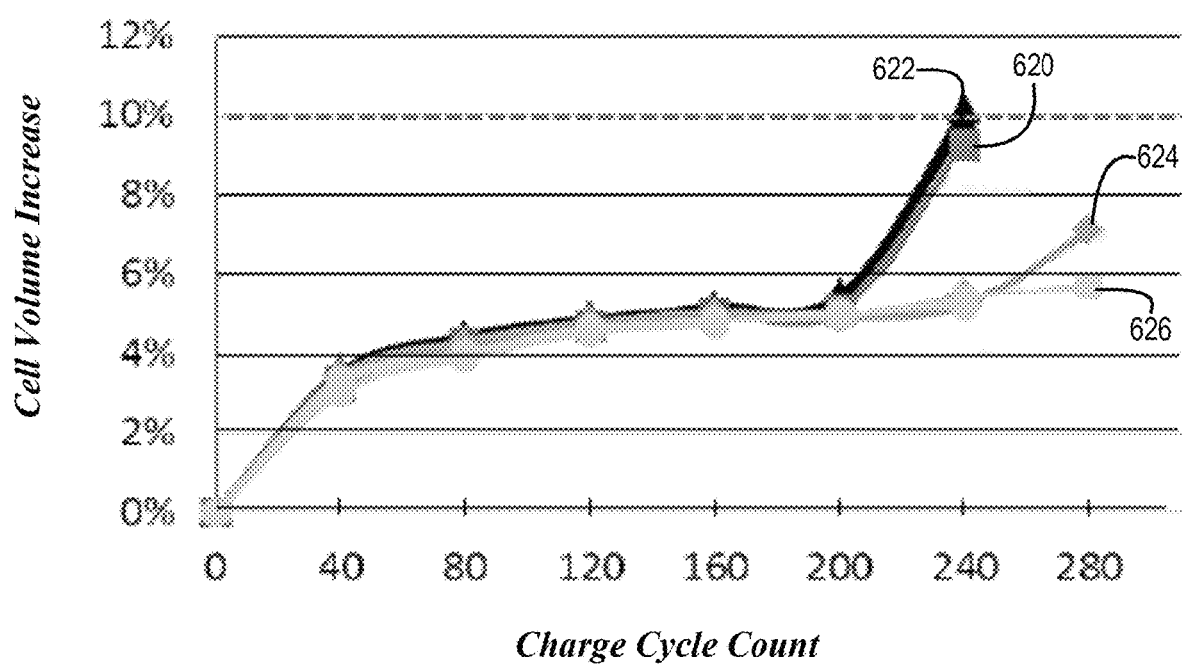
FIG. 6F illustrates example plots of volume increases of a cell of a rechargeable battery a associated with various charge termination current values, according to one or more embodiments.

Turning now to FIG. 6F, example plots of volume increases of a cell of a rechargeable battery a associated with various charge termination current values are illustrated, according to one or more embodiments. In one or more embodiments, plots 620-626 may illustrate increases in a volume of a rechargeable cell of a rechargeable battery associated with numbers of charge cycles. In one or more embodiments, plots 620-626 may illustrate increases in a volume a house of a rechargeable cell associated with numbers of charge cycles. In one example, plot 620 illustrates a percentage volume increase of a cell of a rechargeable battery associated with numbers of charge cycles with a top of charge of 4.4V and a C-rate of 0.3 C. In a second example, plot 622 illustrates a percentage volume increase of a cell of a rechargeable battery associated with numbers of charge cycles with a top of charge of 4.3V and a C-rate of 0.05 C. In a third example, plot 624 illustrates a percentage volume increase of a cell of a rechargeable battery associated with numbers of charge cycles with a top of charge of 4.4V and a C-rate of 0.4 C. In another example, plot 626 illustrates a percentage volume increase of a cell of a rechargeable battery associated with numbers of charge cycles with a top of charge of 4.4V and a C-rate of 0.5 C. As shown, plot 616 illustrates a least a percentage volume increase of a rechargeable cell of a rechargeable battery as a number of charge cycles increases. For example, plot 616 illustrates a least a percentage volume increase of a housing of a rechargeable cell as a number of charge cycles increases.

Figure 7A:
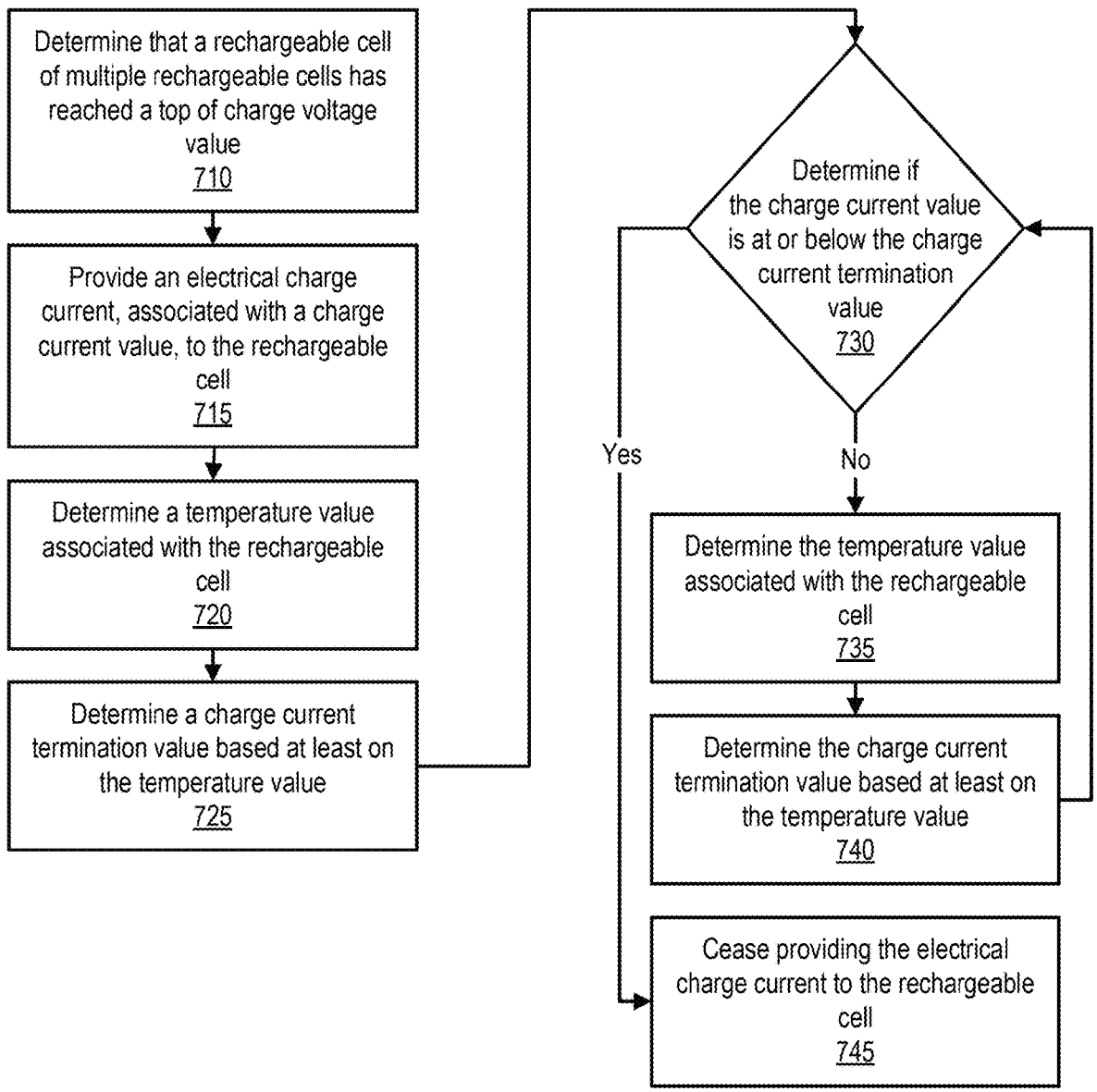
FIG. 7A illustrates a second example of a method of charging a rechargeable cell of a rechargeable battery, according to one or more embodiments.

Turning now to FIG. 7A, a second example of a method of charging a rechargeable cell of a rechargeable battery is illustrated, according to one or more embodiments. At 710, it may be determined that a rechargeable cell of multiple rechargeable cells has reached a top of charge voltage value. For example, BMU 191 may determine that a rechargeable cell 220 of multiple rechargeable cells 220A-220N has reached a top of charge voltage value. At 715, an electrical charge current, associated with a charge current value, may be provided to the rechargeable cell. For example, BMU 191 may provide an electrical charge current, associated with a charge current value, to rechargeable cell 220.

In one or more embodiments, providing the electrical charge current to the rechargeable cell may include providing a decaying electrical charge current to the rechargeable cell. In one example, the decaying electrical charge current may be associated with a linear decay. For instance, the linear decaying electrical charge current may be associated with $f(t)=-m \cdot t$, where m may be a positive real number and t may be time. In another example, the decaying electrical charge current may be associated with an exponential decay. For instance, the decaying electrical charge current may be associated with $f(t)=m \cdot b^{-t}$, where m may be a positive real number, b may be a real number greater than one (1), and it may be time. As an example, b may be two (2). As another example, b may be Euler's number. In one or more embodiments, providing the electrical charge current to the rechargeable cell may be performed in response to determining that the rechargeable cell has reached the top of charge voltage value.

At 720, a temperature value associated with the rechargeable cell may be determined. For example, BMU 191 may determine a temperature value associated with rechargeable cell 220. For instance, BMU 191 may receive the temperature value associated with rechargeable cell 220 from a temperature sensor. At 725, a charge current termination value may be determined based at least on the temperature value. For example, BMU 191 may determine a charge current termination value based at least on the temperature value. For instance, BMU 191 may determine the charge current termination value from a lookup table based at least on the temperature value.

In one or more embodiments, determining a charge current termination value based at least on the temperature value may include utilizing a lookup table. For example, BMU 191 may include the lookup table. For instance, BMU 191 may determine the charge current termination value based at least on the temperature value may include utilizing the lookup table. In one or more embodiments, plot 607 (illustrated in FIG. 6C) may be a plot of values of the lookup table. In one or more embodiments, the lookup table may include temperature value ranges respectively associated with charge current termination values. For example, if the temperature value is within a temperature value range of the temperature value ranges, a respectively associated charge current termination value may be determined as the charge current termination value.

At 730, it may be determined if the charge current value is at or below the charge current termination value. For example, BMU 191 may determine if the charge current value is at or below the charge current termination value. If charge current value is not at and is not below the charge current termination value, the temperature value associated with the rechargeable cell may be determined, at 735. For example, BMU 191 may determine the temperature value associated with the rechargeable cell. In one or more embodiments, method element 735 may be performed in accordance with method element 720. In one or more embodiments, the temperature value associated with the rechargeable cell determined at 735 may be different from the temperature value associated with the rechargeable cell determined at 720. In one or more embodiments, the temperature value associated with the rechargeable cell determined at 735 may be different from the temperature value associated with the rechargeable cell determined at 735 of a previous iteration.

At 740, the charge current termination value may be determined based at least on the temperature value. For example, BMU 191 may determine the charge current termination value based at least on the temperature value. In one or more embodiments, method element 740 may be performed in accordance with method element 725. In one or more embodiments, the charge current termination value determined at 740 may be different from the charge current termination value determined at 725. In one or more embodiments, the charge current termination value determined at 740 may be different from the charge current termination value determined at 740 of a previous iteration. In one or more embodiments, the method may proceed to 730. In one or more embodiments, while the charge current value is not at and is not below the charge current termination value, method elements 735 and 740 may be performed. In one or more embodiments, another boundary condition may be utilized. For example, while the charge current value is not below the charge current termination value, method elements 735 and 740 may be performed. If the temperature value is at or below the charge current termination value, providing the electrical charge current to the rechargeable cell may be ceased, at 745. For example, BMU 191 may cease providing the electrical charge current to rechargeable cell 220 if the temperature value is at or below the charge current termination value.

Figure 7B:
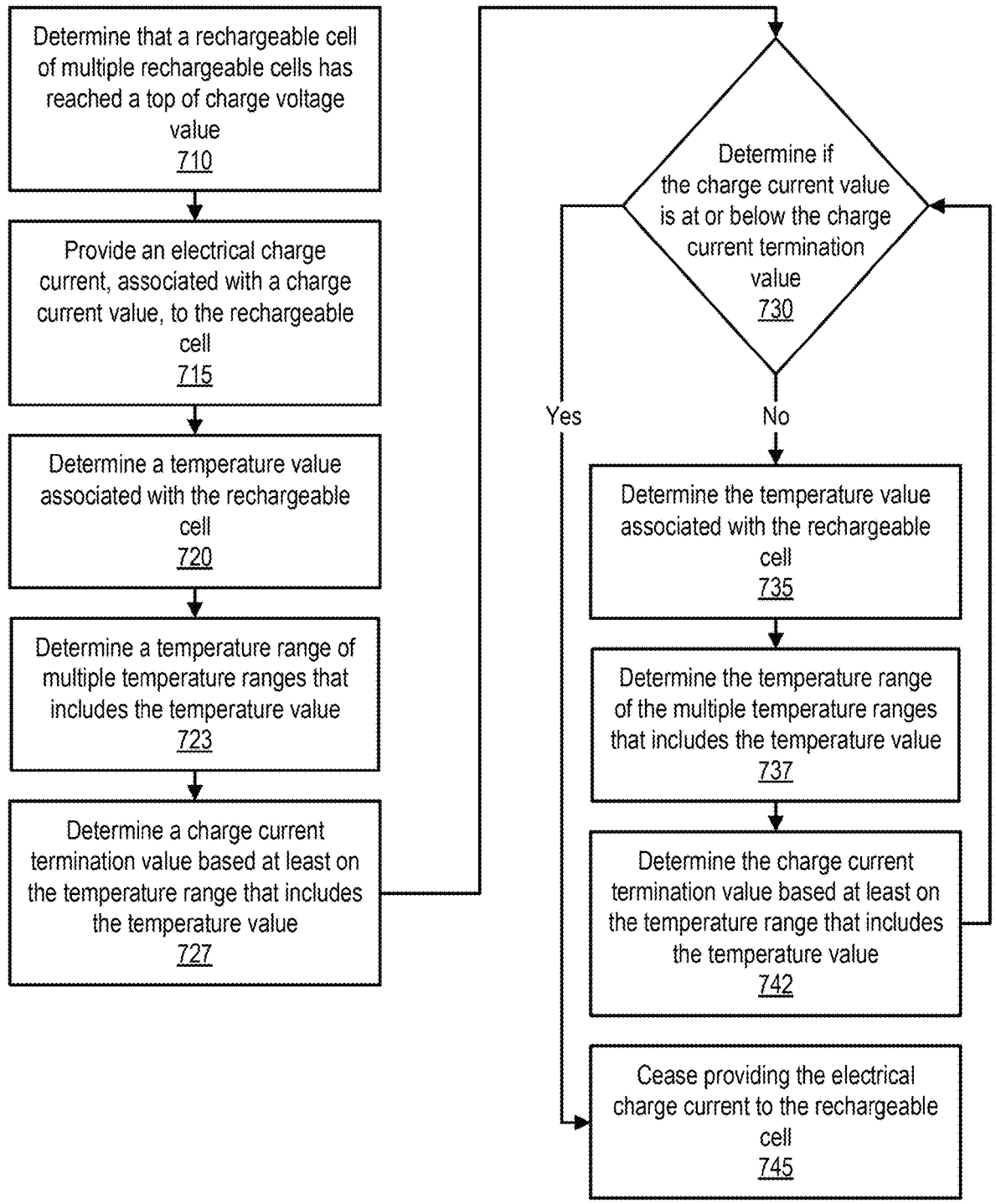
FIG. 7B illustrates another example of a method of charging a rechargeable cell of a rechargeable battery, according to one or more embodiments.

Turning now to FIG. 7B, another example of a method of charging a rechargeable cell of a rechargeable battery is illustrated, according to one or more embodiments. At 710, it may be determined that a rechargeable cell of multiple rechargeable cells has reached a top of charge voltage value. For example, BMU 191 may determine that a rechargeable cell 220 of multiple rechargeable cells 220A-220N has reached a top of charge voltage value. At 715, an electrical charge current, associated with a charge current value, may be provided to the rechargeable cell. For example, BMU 191 may provide an electrical charge current, associated with a charge current value, to rechargeable cell 220.

In one or more embodiments, providing the electrical charge current to the rechargeable cell may include providing a decaying electrical charge current to the rechargeable cell. In one example, the decaying electrical charge current may be associated with a linear decay. For instance, the linear decaying electrical charge current may be associated with $f(t)=-m \cdot t$, where m may be a positive real number and t may be time. In another example, the decaying electrical charge current may be associated with an exponential decay. For instance, the decaying electrical charge current may be associated with $f(t)=m \cdot b^{-t}$, where m may be a positive real number, b may be a real number greater than one (1), and it may be time. As an example, b may be two (2). As another example, b may be Euler's number. In one or more embodiments, providing the electrical charge current to the rechargeable cell may be performed in response to determining that the rechargeable cell has reached the top of charge voltage value.

At 720, a temperature value associated with the rechargeable cell may be determined. For example, BMU 191 may determine a temperature value associated with rechargeable cell 220. For instance, BMU 191 may receive the temperature value associated with rechargeable cell 220 from a temperature sensor. At 723, a temperature range of multiple temperature ranges that includes the temperature value may be determined. For example, BMU 191 may determine a temperature range of multiple temperature ranges that includes the temperature value.

In one or more embodiments, a lookup table may include multiple temperature ranges respectively associated with multiple charge current termination values. For example, BMU 191 may include the lookup table. In one or more embodiments, plot 607 (illustrated in FIG. 6C) may be a plot of multiple temperature ranges respectively associated with multiple charge current termination values. For example, if the temperature value is within a temperature value range of the temperature value ranges, a respectively associated charge current termination value may be determined as the charge current termination value.

At 727, a charge current termination value may be determined based at least on the temperature range that includes the temperature value. For example, BMU 191 may determine a charge current termination value based at least on the temperature range that includes the temperature value. At 730, it may be determined if the charge current value is at or below the charge current termination value. For example, BMU 191 may determine if the charge current value is at or below the charge current termination value. If charge current value is not at and is not below the charge current termination value, the temperature value associated with the rechargeable cell may be determined, at 735. For example, BMU 191 may determine the temperature value associated with the rechargeable cell. In one or more embodiments, method element 735 may be performed in accordance with method element 720. In one or more embodiments, the temperature value associated with the rechargeable cell determined at 735 may be different from the temperature value associated with the rechargeable cell determined at 720. In one or more embodiments, the temperature value associated with the rechargeable cell determined at 735 may be different from the temperature value associated with the rechargeable cell determined at 735 of a previous iteration.

At 737, the temperature range of the multiple temperature ranges that includes the temperature value may be determined. For example, BMU 191 may determine the temperature range of the multiple temperature ranges that includes the temperature value. In one or more embodiments, method element 737 may be performed in accordance with method element 723. In one or more embodiments, the temperature range determined at 737 may be different from the temperature value associated with the rechargeable cell determined at 723. In one or more embodiments, the temperature range determined at 737 may be different from the temperature range determined at 737 of a previous iteration.

At 742, the charge current termination value may be determined based at least on the temperature range that includes the temperature value. For example, BMU 191 may determine the charge current termination value based at least on the temperature range that includes the temperature value. In one or more embodiments, method element 742 may be performed in accordance with method element 727. In one or more embodiments, the charge current termination value determined at 742 may be different from the charge current termination value determined at 727. In one or more embodiments, the charge current termination value determined at 742 may be different from the charge current termination value determined at 742 of a previous iteration. In one or more embodiments, the method may proceed to 730. In one or more embodiments, while the charge current value is not at and is not below the charge current termination value, method elements 735, 737, and 742 may be performed. In one or more embodiments, another boundary condition may be utilized. For example, while the charge current value is not below the charge current termination value, method elements 735, 737, and 742 may be performed. If the temperature value is at or below the charge current termination value, providing the electrical charge current to the rechargeable cell may be ceased at 745. For example, BMU 191 may cease providing the electrical charge current to rechargeable cell 220 if the temperature value is at or below the charge current termination value.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with at least a portion of one or more flowcharts, at least a portion of one or more systems, at least a portion of one or more methods, and/or at least a portion of one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   a rechargeable battery that includes a plurality of rechargeable cells and a battery management unit; and
   at least one processor configured to execute instructions stored in a memory medium;
   wherein the rechargeable battery is configured to provide power to the at least one processor; and
   wherein the battery management unit is configured to:
   determine that a rechargeable cell of the plurality of rechargeable cells has reached a top of charge voltage value;
   in response to determining that the rechargeable cell has reached the top of charge voltage value, provide an electrical charge current, associated with a charge current value, to the rechargeable cell;
   determine a temperature value associated with the rechargeable cell;
   determine a temperature range of multiple temperature ranges that includes the temperature value;
   determine a charge current termination value based at least on the temperature range that includes the temperature value;
   while the charge current value is not at and is not below the charge current termination value:
     determine the temperature value associated with the rechargeable cell;
     determine the temperature range of the multiple temperature ranges that includes the temperature value; and determine the charge current termination value based at least on the temperature range of the multiple temperature ranges that includes the temperature value; and cease providing the electrical charge current to the rechargeable cell.

2. The information handling system of claim 1, wherein the battery management unit includes a lookup table that includes the multiple temperature ranges.

3. The information handling system of claim 1, wherein, to provide the electrical charge current to the rechargeable cell, the battery management unit is further configured to decrease the electrical charge current as time increases.

4. The information handling system of claim 3, wherein, to decrease the electrical charge current as the time increases, the battery management unit is further configured to provide the electrical charge current as an exponential decay.

5. The information handling system of claim 1, wherein, to determine the temperature value associated with the rechargeable cell, the battery management unit is further configured to receive the temperature value from a temperature sensor.

6. The information handling system of claim 5, wherein the rechargeable battery includes the temperature sensor.

7. The information handling system of claim 1, further comprising:
a rechargeable battery charger that includes a current source;
wherein, to provide the electrical charge current to the rechargeable cell, the battery management unit is further configured to configure the current source to provide the electrical charge current to the rechargeable cell.

8. A method, comprising:
determining that a rechargeable cell of a plurality of rechargeable cells of a rechargeable battery has reached a top of charge voltage value;
in response to the determining that the rechargeable cell has reached the top of charge voltage value, providing an electrical charge current, associated with a charge current value, to the rechargeable cell;
determining a temperature value associated with the rechargeable cell;
determining a temperature range of multiple temperature ranges that includes the temperature value;
determining a charge current termination value based at least on the temperature range that includes the temperature value;
while the charge current value is not at and is not below the charge current termination value:
determining the temperature value associated with the rechargeable cell;
determining the temperature range of the multiple temperature ranges that includes the temperature value; and
determining the charge current termination value based at least on the temperature range of the multiple temperature ranges that includes the temperature value; and
ceasing providing the electrical charge current to the rechargeable cell.

9. The method of claim 8, wherein the determining the temperature range of the multiple temperature ranges that includes the temperature value includes utilizing a lookup table that includes the multiple temperature ranges.

10. The method of claim 8, wherein the providing the electrical charge current to the rechargeable cell includes decreasing the electrical charge current as time increases.

11. The method of claim 10, wherein the decreasing the electrical charge current as the time increases includes providing the electrical charge current as an exponential decay.

12. The method of claim 8, wherein the determining the temperature value associated with the rechargeable cell includes receiving the temperature value from a temperature sensor.

13. The method of claim 12, wherein the rechargeable battery includes the temperature sensor.

14. The method of claim 8, wherein the providing the electrical charge current to the rechargeable cell includes configuring a current source to provide the electrical charge current to the rechargeable cell.

15. A rechargeable battery, comprising:
a plurality of rechargeable cells; and
a battery management unit;
wherein the battery management unit is configured to:
determine that a rechargeable cell of the plurality of rechargeable cells has reached a top of charge voltage value;
in response to determining that the rechargeable cell has reached the top of charge voltage value, provide an electrical charge current, associated with a charge current value, to the rechargeable cell;
determine a temperature value associated with the rechargeable cell;
determine a temperature range of multiple temperature ranges that includes the temperature value;
determine a charge current termination value based at least on the temperature range that includes the temperature value;
while the charge current value is not at and is not below the charge current termination value:
determine the temperature value associated with the rechargeable cell;
determine the temperature range of the multiple temperature ranges that includes the temperature value; and
determine the charge current termination value based at least on the temperature value; and
cease providing the electrical charge current to the rechargeable cell.

16. The rechargeable battery of claim 15, wherein the battery management unit includes a lookup table that includes the multiple temperature ranges.

17. The rechargeable battery of claim 15, wherein, to provide the electrical charge current to the rechargeable cell, the battery management unit is further configured to decrease the electrical charge current as time increases.

18. The rechargeable battery of claim 17, wherein, to decrease the electrical charge current as the time increases, the battery management unit is further configured to provide the electrical charge current as an exponential decay.

19. The rechargeable battery of claim 15, wherein, to determine the temperature value associated with the rechargeable cell, the battery management unit is further configured to receive the temperature value from a temperature sensor.

20. The rechargeable battery of claim 19, wherein the rechargeable battery includes the temperature sensor.

* * * * *